(12) United States Patent
Luo et al.

(10) Patent No.: US 12,683,599 B2
(45) Date of Patent: Jul. 14, 2026

(54) PROGNOSIS AND CONTROL OF POWER MODULE FOR ELECTRIC LOAD

(71) Applicant: GM GLOBAL TECHNOLOGY OPERATIONS LLC, Detroit, MI (US)

(72) Inventors: Yilun Luo, Ann Arbor, MI (US); Benjamin S. Ngu, Royal Oak, MI (US); Chandra S. Namuduri, Troy, MI (US); Mohammad N. Anwar, Northville, MI (US); Eric B. Gach, Clarkston, MI (US); Abir Chatterjee, Novi, MI (US); Rashmi Prasad, Troy, MI (US); Khorshed Mohammed Alam, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 287 days.

(21) Appl. No.: 18/606,559

(22) Filed: Mar. 15, 2024

(65) Prior Publication Data

US 2025/0293679 A1 Sep. 18, 2025

(51) Int. Cl.
| | |
|---|---|
| *H02P 1/04* | (2006.01) |
| *H02P 27/08* | (2006.01) |
| *H02P 29/68* | (2016.01) |
| *H03K 17/082* | (2006.01) |
| *H03K 17/08* | (2006.01) |

(52) U.S. Cl.
CPC ........... *H03K 17/082* (2013.01); *H02P 27/08* (2013.01); *H02P 29/68* (2016.02); *H03K 2017/0806* (2013.01)

(58) Field of Classification Search
CPC ........... H02P 29/68; H02P 27/08; H02P 27/00
See application file for complete search history.

(56) References Cited

U.S. PATENT DOCUMENTS

2022/0392459 A1* 12/2022 Lai ........................ G10L 19/005

FOREIGN PATENT DOCUMENTS

JP 2017-169145 A 9/2017

* cited by examiner

*Primary Examiner* — Karen Masih
(74) *Attorney, Agent, or Firm* — Quinn IP Law

(57) ABSTRACT

A system for prognosis and control of a power module includes a gate driver circuit and a controller circuit. The gate driver circuit drives a target gate node of a target power transistor in response to a pulse width modulation signal, measures a target gate voltage, switches a desaturation signal in response to the target power transistor switching between an off state and an on state, measures a target transistor voltage, and measures a target transistor current. The controller circuit modulates the pulse width modulation signal to increase the target gate voltage, determines a target threshold voltage as the target gate voltage in response to the desaturation signal switching states, determines a target on-resistance based on the target transistor voltage and the target transistor current, and controls the target power transistor based on the target threshold voltage and the target on-resistance.

20 Claims, 6 Drawing Sheets

PROGNOSIS AND CONTROL OF POWER MODULE FOR ELECTRIC LOAD

INTRODUCTION

The present disclosure relates to a system and a method for prognosis and control of a power module for an electric load.

Power modules designs for electric motors typically incorporate multiple power transistors. In some designs, the same type of power transistor is implemented. In hybrid power modules, different transistor types, different transistor sizes, and/or different semiconductor materials are implemented. Part-to-part variations, type-to-type variations, semiconductor-to-semiconductor variations, size variations, degradations in threshold voltages, and degradations in drain-to-source/collector-to-emitter on-resistances cause second order effects during operation. The second order effects generally include, but are not limited to, current sharing mismatched, false ON, overvoltage spikes, and electromagnetic interferences.

Accordingly, those skilled in the art continue with research and development efforts in the field of prognosis and control of power modules for electric loads.

SUMMARY

A system for prognosis and control of a power module for an electric load is provided herein. The system includes a gate driver circuit and a controller circuit. The gate driver circuit is couplable to a target power transistor in the power module. The target power transistor includes a target gate node, a target high-side node, and a target low-side node. The gate driver circuit is operational to drive the target gate node in response to a pulse width modulation signal, measure a target gate voltage between the target gate node and the target low-side node, switch a desaturation signal in response to the target power transistor switching between an off state and an on state, measure a target transistor voltage between the target high-side node and the target low-side node, and measure a target transistor current from the target high-side node to the target low-side node. The controller circuit is in electrical communication with the gate driver circuit. The controller circuit is operational to modulate the pulse width modulation signal to increase the target gate voltage, determine a target threshold voltage of the target power transistor as the target gate voltage in response to the desaturation signal switching from the off state to the on state, determine a target on-resistance of the target power transistor based on the target transistor voltage and the target transistor current, and control the target power transistor based on the target threshold voltage and the target on-resistance.

In one or more embodiments of the system, the controller circuit is further operational to command a reduction of a high-power voltage received by the power module during the determinations of the target threshold voltage and the target on-resistance of the target power transistor.

In one or more embodiments of the system, the measurement of the target transistor voltage is performed at a predetermined testing temperature and two different current points.

In one or more embodiments of the system, the controller circuit is further operational to control the gate driver circuit to precondition the target gate node prior to the determinations of the target threshold voltage and the target on-resistance of the target power transistor.

In one or more embodiments of the system, the pulse width modulation signal is modulated at a plurality of different amplitudes.

In one or more embodiments of the system, the controller circuit is further operational to control a temperature of the power module to one or more of (i) an efficient operating temperature and (ii) a peak torque operating temperature during the determinations of the target threshold voltage and the target on-resistance of the target power transistor.

In one or more embodiments of the system, the controller circuit is further operational to control a sampling timing for the measurements of the target transistor voltage and the target transistor current.

In one or more embodiments of the system, the power module includes a plurality of power transistors. The controller circuit is further operational to command one or more of (i) the gate driver circuit and (ii) a multiplexer to electrically isolate the target power transistor from the plurality of power transistors during the determinations of the target threshold voltage and the target on-resistance of the target power transistor.

In one or more embodiments of the system, the controller circuit is further operational to detect a degradation of the target power transistor based on the target threshold voltage and the target on-resistance.

In one or more embodiments of the system, the controller circuit is further operational to detect a failure of the target power transistor based on the target threshold voltage and the target on-resistance.

In one or more embodiments of the system, the controller circuit is further operational to calculate a temperature of the target power transistor based on the target on-resistance.

In one or more embodiments of the system, the power module includes a plurality of power transistors, and the plurality of power transistors include one or more of (i) a plurality of different transistor types and (ii) a plurality of different semiconductor types.

In one or more embodiments, the system includes a galvanic isolation circuit between a high-power voltage received by the power module and a power supply voltage received by the controller circuit.

In one or more embodiments of the system, the power module includes a plurality of power transistors having a plurality of threshold voltages and a plurality of on-resistances. The controller circuit is further operational to adjust one or more of (i) a switching speed of the plurality of power transistors and (ii) switch utilization ratio of the plurality of power transistors based on one or more of (1) the plurality of threshold voltages and (2) the plurality of on-resistances.

In one or more embodiments of the system, the controller circuit is further operational to utilize the target threshold voltage and the target on-resistance for one or more of thermal control, dynamic switching control, and degradation mitigation of the target power transistor.

In one or more embodiments, the system includes one or more of a discrete temperature sensor operational to measure a temperature of the target power transistor, and a discrete current sensor operational to measure the target transistor current.

In one or more embodiments of the system, the controller circuit is further operational to detect a degradation in the target power transistor based on one or more of the target threshold voltage and the target on-resistance, and assert an alert signal in response to the detection of the degradation.

In one or more embodiments of the system, the gate driver circuit is further operational to measure one or more of (i) a current across a parasitic inductance in series with the target power transistor, and (ii) a voltage across a parasitic capacitance in parallel with the target power transistor. The controller circuit is further operational to calculate a switching speed of the target power transistor in response to one or more of (i) the current across the parasitic inductance, and (ii) the voltage across the parasitic capacitance.

A method for prognosis and control of a power module for an electric load is provided herein. The method includes driving a target gate node of a target power transistor of the power module in response to a pulse width modulation signal with a gate driver circuit. The target power transistor includes the target gate node, a target high-side node, and a target low-side node. The method further includes measuring a target gate voltage between the target gate node and the target low-side node, switching a desaturation signal in response to the target power transistor switching between an off state and an on state, measuring a target transistor voltage between the target high-side node and the target low-side node, and measuring a target transistor current from the target high-side node to the target low-side node. The method includes modulating the pulse width modulation signal to increase the target gate voltage with a controller circuit in electronic communication with the gate driver circuit, determining a target threshold voltage of the target power transistor as the target gate voltage in response to the desaturation signal switching from the off state to the on state, determining a target on-resistance of the target power transistor based on the target transistor voltage and the target transistor current, and controlling the target power transistor based on the target threshold voltage and the target on-resistance.

A vehicle is provided herein. The vehicle includes an electric motor, a power module, a gate driver circuit, and a controller circuit. The gate driver circuit is couplable to a target power transistor in the power module. The target power transistor includes a target gate node, a target high-side node, and a target low-side node. The gate driver circuit is operational to drive the target gate node in response to a pulse width modulation signal, measure a target gate voltage between the target gate node and the target low-side node, switch a desaturation signal in response to the target power transistor switching between an off state and an on state, measure a target transistor voltage between the target high-side node and the target low-side node, and measure a target transistor current from the target high-side node to the target low-side node. The controller circuit is in electrical communication with the gate driver circuit. The controller circuit is operational to modulate the pulse width modulation signal to increase the target gate voltage, determine a target threshold voltage of the target power transistor as the target gate voltage in response to the desaturation signal switching from the off state to the on state, determine a target on-resistance of the target power transistor based on the target transistor voltage and the target transistor current, and control the target power transistor based on the target threshold voltage and the target on-resistance.

The above features and advantages and other features and advantages of the present disclosure are readily apparent from the following detailed description of the best modes for carrying out the disclosure when taken in connection with the accompanying drawings.

DETAILED DESCRIPTION

Embodiments of the disclosure provide a system and/or a method for prognosis and control of a power module for an electric load. The systems/method measures gate-to-source and/or gate-to-emitter threshold voltages (Vth) and on-resistances (Rdson) of each power transistor in uni-semiconductor power modules (PM) and/or hybrid power modules for inverters, converters and/or motor drivers. Various embodiments utilize gate driver current sources (Is) or voltage sources (Vs) with pulse width modulation (PWM) control to optimally increase the gate voltages of power transistors until the threshold voltages Vth are reached and the power transistors switch from an off state to an on state. The measurements enable on-chip measurement of threshold voltages Vth and on-resistances Rdson to allow fault detection, degradation detection, and improve inverter control to optimize current sharing and reduce loss, reverse recovery, overshoot, electromagnetic interference, and bearing currents. In hybrid switch power module designs, silicon (Si) insulated gate bipolar transistors (IGBT) may see improved switching speeds and losses, while wide-bandgap (WBG) power transistor usage may be reduced. Without the built-in prognosis, the switching speeds of the power transistors are usually reduced to control overshoot, accommodate part-to-part variations, and degradations resulting in loss of performance.

Figure 1:
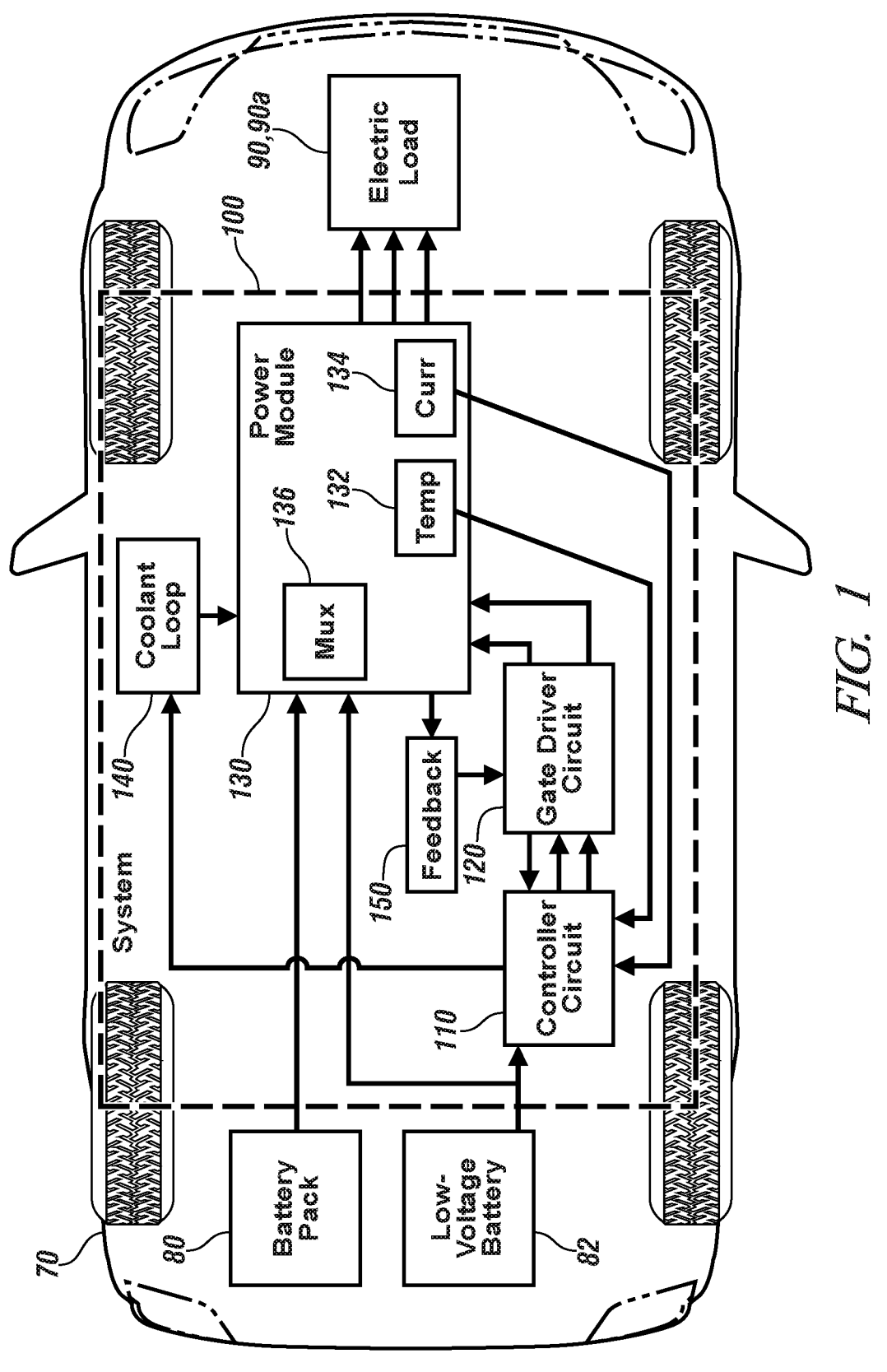
FIG. 1 is a schematic plan diagram illustrating a context of a machine.

Referring to FIG. 1, a schematic plan diagram illustrating a context of a machine is shown. The machine may implement a vehicle 70. The vehicle 70 generally comprises a battery pack 80, a low-voltage battery 82, one or more electric loads 90 (one electric load 90 is shown for clarity), and a system 100. The system 100 may include a controller circuit 110, a gate driver circuit 120, a power module 130, a coolant loop 140, and a feedback circuit 150. The power module 130 generally includes one or more temperature sensors 132 (one temperature sensor 132 shown for clarity), one or more current sensors 134 (one current sensor 134 shown for clarity), and an optional multiplexer 136.

The vehicle 70 may include, but is not limited to, mobile objects such as electric vehicles, hybrid vehicles, internal-combustion engine vehicles, trucks, motorcycles, boats, trains and/or aircraft. In some embodiments, the vehicle 70 may include stationary objects such as billboards, kiosks, power back-up systems (e.g., uninterruptible power supplies) and/or marquees. Other types of vehicles 70 may be implemented to meet the design criteria of particular applications.

The battery pack 80 implements a high-voltage battery pack configured to store electrical energy. The battery pack 80 is generally operational to receive electrical power from an on-vehicle alternator and/or an off-vehicle charging station, and provide electrical power to the system 100. The battery pack 80 may include multiple battery cells electrically connected in series and/or in parallel between a positive battery pack terminal and a negative battery pack terminal. In various embodiments, the battery pack 80 may provide approximately 200 to 1,000 volts DC (direct current) electrical potential between the positive battery pack terminal and the negative battery pack terminal. Other battery voltages may be implemented to meet the design criteria of particular applications.

The low-voltage battery 82 implements a battery configured to store electrical energy. The low-voltage battery 82 is operational to provide electrical power to the system 100 (e.g., the controller circuit 110 and optionally a portion of the power module 130). In various embodiments, the low-voltage battery 82 may provide approximately 12 to 24 volts DC electrical potential between a positive battery a terminal and a negative battery a terminal. Other battery voltages may be implemented to meet the design criteria of particular applications.

The electric load 90 (or individual ones of multiple electric loads 90) implements a high-power electrical load. In mobile embodiments, the electric load 90 implements an electric motor 90a, such as a hybrid gas/electric motor and/or a traction motor. The electric motor 90a is generally operational to provide rotation and torque to drive wheels of the vehicle 70 to propel the vehicle 70 about the ground and/or roads. The electrical power consumed by the electric motor 90a may be provided by the battery pack 80 and/or the alternator of the vehicle 70. In various stationary embodiments, the electric load 90 implements a pump, a fan, an electric heater, an uninterruptible power supply, a DC-AC power supply and/or a welding power supply. Other types of electrical loads may be implemented to meet the design criteria of particular applications.

The system 100 implements a power conversion system. The system 100 is operational to convert DC power received from the battery pack 80 to single-phase and/or multiphase AC power provided to the electric load 90. The system 100 may drive gate nodes of power transistors in the power module 130 in response to pulse width modulation signals. To characterize the individual transistors in the power module 130, a single target gate node of a target power transistor may be exercised at a time. A temperature of the target power transistor may be adjusted by driving the electric load 90 to warm the power transistors and/or controlling the coolant loop 140 to cool the power transistors.

The target power transistor may be electrically isolated from the other power transistors by the system 100. The system 100 subsequently modulates a pulse width modulation signal in a preconditioning pattern applied to the target gate node of the target power transistor. The pulse width modulation signal is then adjusted to increase a gate voltage between the target gate node and a corresponding source/emitter (e.g., low-side) node of the target power transistor. The system 100 switches a desaturation signal in response to the target power transistor switching between an off state and an on state (e.g., the power transistor operates in a saturated region). Subsequently, the system 100 measures the gate voltage in response to the target power transistor switching to the on state. The measured gate voltage is determined to be and is recorded as a threshold voltage Vth of the target power transistor in response to the desaturation signal switching from the off state to the on state.

The system 100 also measures a transistor voltage between a corresponding drain/collector (e.g., high-side) node of the target power transistor and the corresponding source/emitter node of the target power transistor. The system 100 also measures a transistor current from the corresponding drain/collector node to the corresponding source/emitter node. The system 100 determines a target on-resistance Rdson of the target power transistor based on the transistor voltage and the transistor current. Once the power transistors in the power module 130 are characterized, the system 100 controls the individual power transistors based on the individual threshold voltages Vth and the individual on-resistances Rdson to balance currents, temperatures, and performances.

The controller circuit 110 implements one or more computers. In various embodiments, the controller circuit 110 generally includes at least one microcontroller. The at least one microcontroller may include one or more processors, each of which may be embodied as a separate processor, an application specific integrated circuit (ASIC), a field programmable gate array (FPGA), or a dedicated electronic control unit. The at least one microcontroller may be an electronic processor (implemented in hardware, software executing on hardware, or a combination of both). The at least one microcontroller may also include tangible, non-transitory memory, (e.g., read-only memory in the form of optical, magnetic, and/or flash memory). For example, the at least one microcontroller may include application-suitable amounts of random-access memory, read-only memory, flash memory and other types of electrically-erasable programmable read-only memory, as well as accompanying hardware in the form of a high-speed clock or timer, analog-to-digital and digital-to-analog circuitry, and input/output circuitry and devices, as well as appropriate signal conditioning and buffer circuitry.

Computer-readable and executable instructions embodying the present method may be recorded (or stored) in the memory and executed as set forth herein. The executable instructions may be a series of instructions employed to run applications on the at least one microcontroller (either in the foreground or background). The at least one microcontroller may receive commands and information, in the form of one or more input signals from various controls or components and communicate instructions to the other electronic components.

The gate driver circuit 120 implements a multichannel driver circuit that controls the power transistors in the power module 130. The gate driver circuit is operational to drive the gate nodes of the power transistors in response to the pulse width modulation signals received from the controller circuit 110, measure the respective gate voltages between the corresponding gate node and the corresponding source/emitter nodes, and switch the desaturation signal in response to a target power transistor switching between the off state and the on state. The gate driver circuit 120 is also operational to measure the transistor voltages between the drain/collector nodes and the source/emitter nodes, and measure the transistor currents from the drain/collector node to the source/emitter nodes.

The power module 130 implements a high-current/high-voltage electrical power switching module. The power module 130 is operational to switch the DC electrical power received from the battery pack 80 into single-phase and/or multi-phase (e.g., 3-phase) AC electrical power. Control of the switching is provided by gate signals generated by the gate driver circuit 120. The gate signals control the gate nodes of the power transistors to adjust the electrical power presented by the power module 130 to the electric load 90.

The power module 130 may include one or more temperature sensors 132 (one temperature sensor 132 is shown for clarity), one or more current sensors 134 (one current sensor 134 is shown for clarity), and a multiplexer 136.

In various embodiments, each temperature sensor 132 is mounted in thermal contact with a respective power transistor. In other embodiments, one or a few (e.g., four) temperature sensors 132 are mounted about the power module 130. Each temperature sensor 132 is operational to measure a temperature of the respective power transistor and/or a neighboring groups of power transistors. The measured temperatures are reported to the controller circuit 110. The controller circuit 110 may use the measured temperatures to adjust a heating and a cooling of the power module 130 while measuring the threshold voltages Vth and/or the on-resistances Rdson of the power transistors.

In some embodiments, the temperature sensors 132 may be omitted. In such designs, the temperature of the power transistors may be determined based on the measured Rdson. As the temperature of the target power transistor changes, a conductivity of the drain/collector to source/emitter channel of the transistor changes and so Rdson changes.

In various embodiments, each current sensor 134 is electrically connected to a respective power transistor. Each current sensor 134 is operational to measure the current flowing through the respective power transistor. The measured currents are reported back to the controller circuit 110 to determine the on-resistances Rdson of the power transistors. In other embodiments, a single current sensor 134 may be electrically connected to an input node of the power module 130 that receives the electrical power from the battery pack 80. Where the controller circuit 110 characterizes a single target power transistor at a time, the current sensor 134 may measure the electrical current flowing through the input node and the target power transistor. The measured current is reported back to the controller circuit 110 to determine the on-resistance Rdson of the target power transistor.

The multiplexer 136 implements a high-voltage/low-voltage multiplexer. The multiplexer 136 is operational to alternatively route the high-voltage received from the battery pack 80 or the low-voltage received from the low-voltage battery 82 to the power transistors. During normal operations, the multiplexer 136 may route the high-voltage from the battery pack 80 to the DC busses, to the power transistors, and on to the electric load 90/electric motor 90a. While measuring the power transistors parameters, the multiplexer 136 may route the low voltage from the low-voltage battery 82 to the power transistors.

The coolant loop 140 implements a coolant system in the vehicle 70. The coolant loop 140 is in thermal contact with the power module 130. The coolant loop 140 is operational to remove heat from the power module 130. An amount of heat removed is controlled by the controller circuit 110 to cool the power module 130 to a predetermined temperature while characterizing the power transistors (e.g., Vth and Rdson).

The feedback circuit 150 implements a dc feedback path from the power transistors to a desaturation circuit within the gate driver circuit 120.

Figure 2:
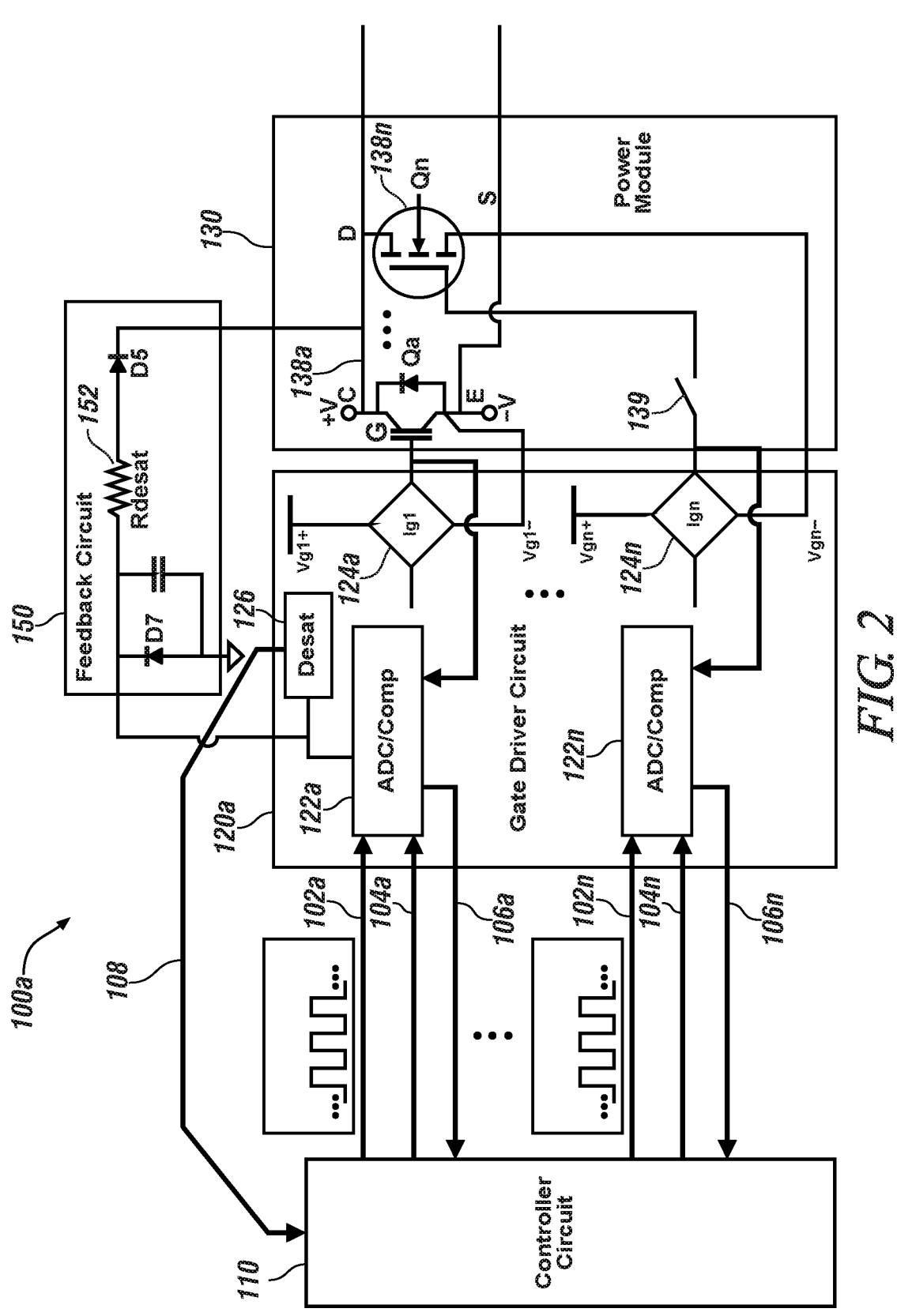
FIG. 2 is a schematic diagram of a system in accordance with one or more exemplary embodiments.

Referring to FIG. 2, a schematic diagram of an example implementation of a system 100a is shown in accordance with one or more exemplary embodiments. The system 100a may be a variation of the system 100. The system 100a includes the controller circuit 110, a gate driver circuit 120a, the power module 130, and the feedback circuit 150. The gate driver circuit 120a is a variation of the gate driver circuit 120. The gate driver circuit 120a implements variable current sources to control the gate voltages of the power transistors in the power module 130.

The gate driver circuit 120a generally includes one or more analog to digital A/D converter and comparator (ADC/Comp) circuits 122a-122n, one or more variable current sources 124a-124n, and a desaturation circuit 126. The power module 130 includes multiple power transistors 138a-138n.

Pulse width modulation signals 102a-102n may be generated by the controller circuit 110 and presented to the gate driver circuit 120a. The pulse width modulation signals 102a-102n convey pulse width modulated voltages that control the variable current sources 124a-124n. The control is based on a duty cycle and/or a voltage amplitude of the pulse width modulation signals 102a-102n. Current selection code signals 104a-104n are generated by the controller circuit 110 and transferred to the gate driver circuit 120a. The current selection code signals 104a-104n determine a target amplitude of the current provided by the variable current sources 124a-124n. Voltage signals 106a-106n are generated by the ADC/Comp circuits 122a-122n and transferred to the controller circuit 110. The voltage signals 106a-106n carry the gate voltages of the corresponding power transistors 138a-138n. A desaturation signal 108 is generated by the desaturation circuit 126 and presented to the controller circuit 110. The desaturation signal 108 indicates if a target power transistor 138a-138n is operating in a saturated mode (e.g., the on state) or not (e.g., the off state).

The A/D converter/compensation circuits (ADC/Comp) 122a-122n is operational to measure the gate voltage of a corresponding power transistor 138a-138n. The measured gate voltages are presented to the controller circuit 110 in the voltage signals 106a-106n.

The variable current sources 124a-124n are operational to generate variable controlled currents that establish the gate currents into the respective power transistors 138a-138n. The variable current sources 124a-124n are controlled by the pulse width modulated signals 102a-102n and the current selection code signals 104a-104n.

The desaturation circuit 126 is operational to determine when one or more of the power transistors 138a-138n has switched operation between off and on conditions with the respective gate source voltage (Vgs) below and exceeding the turn-on threshold voltage (Vth). The desaturation circuit 126 determines the on condition/off condition based on the voltage provided by the feedback circuit 150 from the power module 130.

Each power transistor 138a-138n has a respective gate node (e.g., a first gate node of a first power transistor 138a, a second gate node of a second power transistor 138b, etc.), a respective high-node (e.g., a first high-node of the first power transistor 138a, a second high-node of the second power transistor 138b, etc.), and a respective low-node (e.g., a first low-node of the first power transistor 138a, a second low-node of the second power transistor 138b, etc.) The high-nodes of the power transistors 138a-138n may be wired together and the low-nodes of the power transistors 138a-138n may be wired together. The gate nodes of the power transistors 138a-138n may be wired together or each gate node is directly connected to a respective variable current source 124a-124n in the gate driver circuit 120a. In some embodiments, optional switches 139 may be provided between the gate nodes and the respective variable current sources 124a-124n. The switches 139 may be opened to provide protection for the other power transistors 138a-138n from a preconditioning signal if the gate nodes of the power transistors 138a-138n are connected together.

In various embodiments, the power transistors 138a-138n may implement a similar technology and a similar geometry. The common technology, common type, and common geometry may result in a uni-power module 130 as the power transistors 138a-138n behave in a similar fashion. In some embodiments, the power transistors 138a-138n may be different technologies, different types, and/or different geometries. Such differences may result in hybrid power modules 130. For example, the hybrid power modules may be fabricated with different semiconductor technologies (e.g., Si, SiC, GaN, $Ga_2O_3$, Diamond), different transistor types (e.g., IGBT, MOSFET, HEMT, JFET, Cascode, BJT), and/or different geometry sizes.

Figures 3, 4, 5:
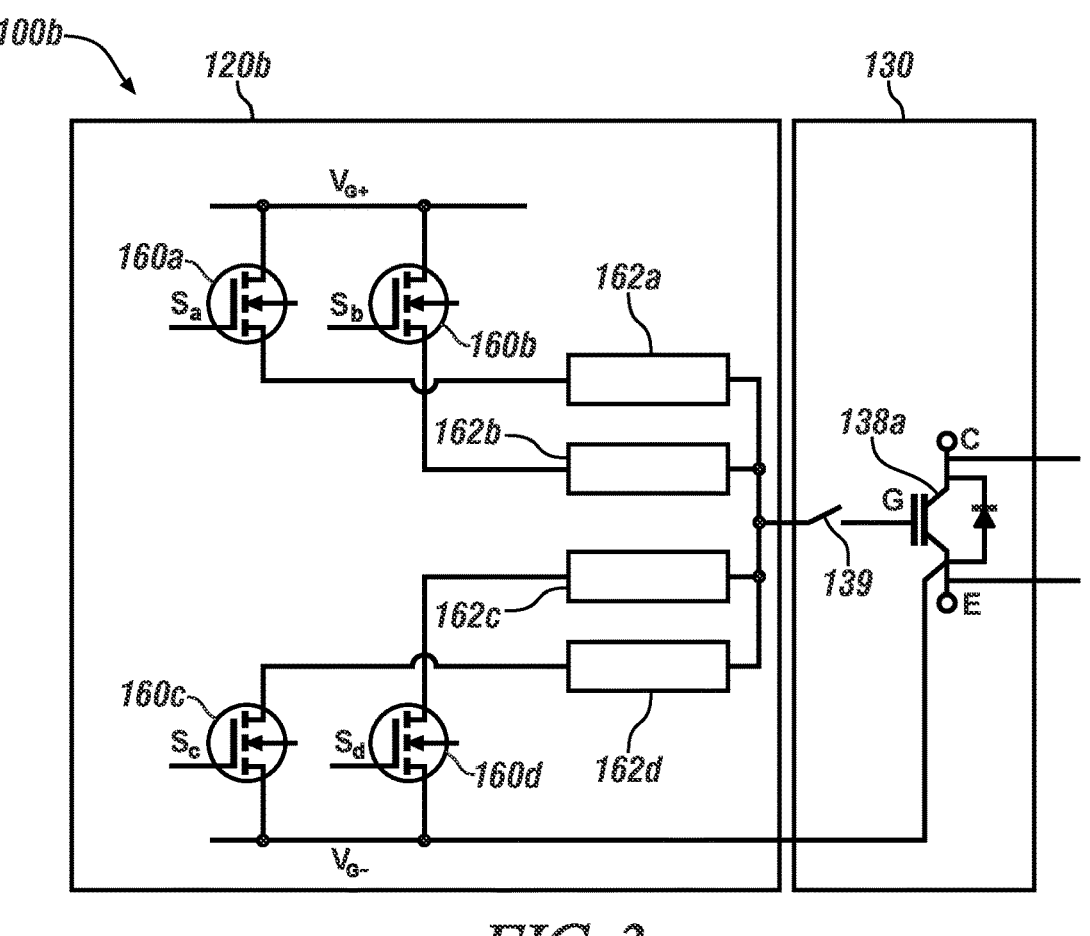
FIG. 3 is a schematic diagram of another system in accordance with one or more exemplary embodiments.
FIG. 4 is a graph of a first pulse width modulation signal at different gate-to-source voltages in accordance with one or more exemplary embodiments.
FIG. 5 is a graph of a second pulse width modulation signal at different gate currents in accordance with one or more exemplary embodiments.

Referring to FIG. 3, a schematic diagram of an example partial implementation of a system 100b is shown in accordance with one or more exemplary embodiments. The system 100b may be a variation of the system 100. The system 100b includes a gate driver circuit 120b and the power module 130. The gate driver circuit 120b is a variation of the gate driver circuit 120. The gate driver circuit 120b implements variable voltage sources to control the gate voltages of the power transistors in the power module 130.

The gate driver circuit 120b generally includes multiple transistors 160a-160d and multiple resistors 162a-162d. Each resistor 162a-162d has a node connected to the gate node of a power transistor (e.g., 138a). The other node of each resistor 162a-162d is connected to a respective transistor 160a-160d. Half of the transistors (e.g., 160a and 160b) are configured as pull-up transistors connected to a positive voltage rail (e.g., $V_{G+}$). The other half of the transistors are configured as pull-down transistors connected to a negative voltage rail (e.g., $V_{G-}$). By switching on/off the various transistors 160a-160d (e.g., 162a=Rg1_ON, 162b=Rg2_ON, 162c=Rg1_Off, and 162d=Rg2_Off), the voltage at the gate node of the transistor 138a may be driven to a specified voltage. The optional switches 139 may be included to protect the other gate nodes.

Referring to FIG. 4, a graph 170 of a first example pulse width modulation signal at different gate-to-source voltages (Vgs) is shown in accordance with one or more exemplary embodiments. The graph 170 has a first axis 172 in units of time and a second axis 174 in units of voltage. A curve 176 illustrates multiple voltage-controlled pulses that have different amplitudes and different duty cycles. The amplitude and/or duty cycles may be adjusted by the controller circuit 110 to change the gate-to-source voltage Vgs and control a rate of change in real-time while characterizing a target power transistor.

Referring to FIG. 5, a graph 180 of a second example pulse width modulation signal at different gate currents (Ig) is shown in accordance with one or more exemplary embodiments. The graph 180 has a first axis 182 in units of time and a second axis 184 in units of current. A curve 186 illustrates multiple current controlled pulses that have different amplitudes and different duty cycles. The amplitude and/or duty cycles may be adjusted by the controller circuit 110 to increase the gate-to-source voltage Vgs (curve 188) and control the rate of change in real-time until the power transistor switches to a conducting state (e.g., curve 192), resulting in a decrease in the drain-to-source voltage (Vds) (curve 190).

Figure 6:
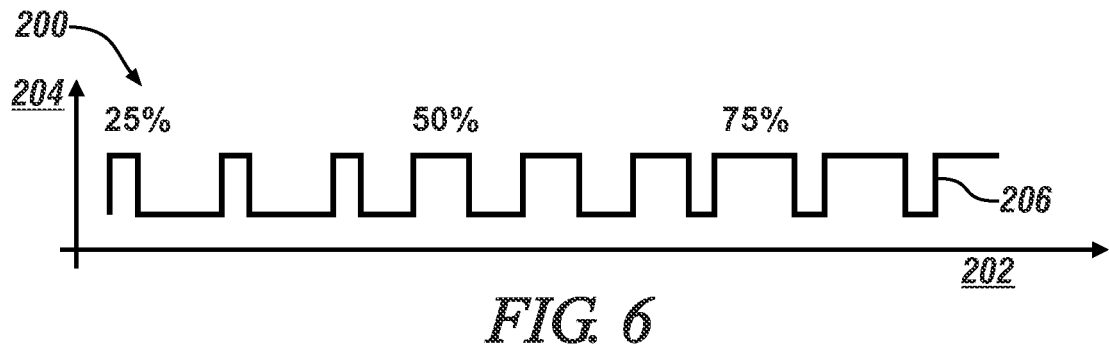
FIG. 6 is a graph of a third pulse width modulation signal at different duty cycles in accordance with one or more exemplary embodiments.

Referring to FIG. 6, a graph 200 of a third example pulse width modulation signal at different duty cycles is shown in accordance with one or more exemplary embodiments. The graph 200 has a first axis 202 in units of time and a second axis 204 in units of amplitude. A curve 206 illustrates multiple pulses that have different duty cycles (e.g., 255, 50% and 75% duty cycles). The duty cycles may be adjusted by the controller circuit 110 to change the gate-to-source voltage Vgs and control the rate of change in real-time while characterizing the power transistor.

Figure 7:
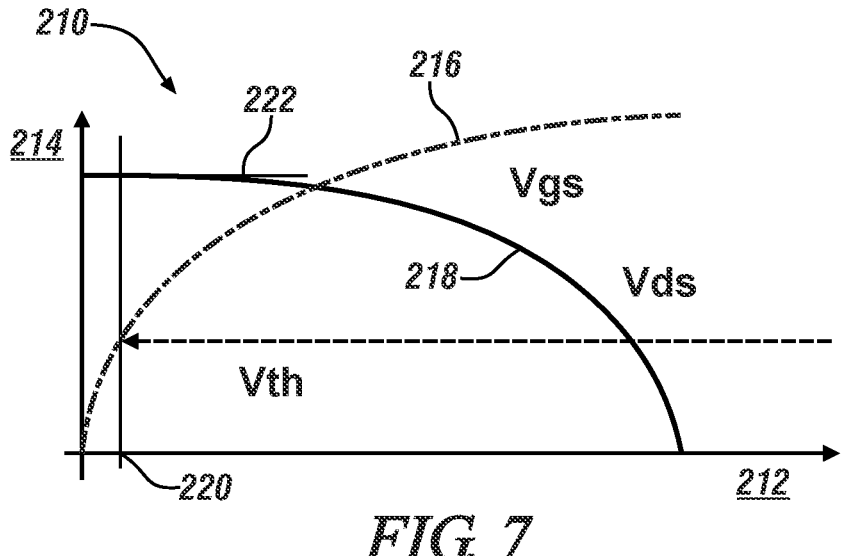
FIG. 7 is a graph that illustrates a threshold voltage determination in accordance with one or more exemplary embodiments.

Referring to FIG. 7, a graph 210 that illustrates an example threshold voltage determination is shown in accordance with one or more exemplary embodiments. The graph 210 has a first axis 212 in units of voltage and a second axis 214 in units of voltage. A curve 216 illustrates a gate-to-source voltage Vgs. A curve 218 illustrates a transistor (or drain-to-source) voltage Vds. Where the gate-to-source voltage Vgs increases to point 220, the target power transistor begins to conduct and so the target transistor voltage Vds begins to decrease from a non-conducting voltage 222. Therefore, the point 220 may determine the threshold voltage Vth for the target power transistor.

Referring back to FIGS. 1 and 2, a method for measuring the threshold voltage Vth of a target power transistor is described as follows. A junction temperature of the target power transistor is adjusted to a predetermined temperature by slowly switching the target power transistor on and off to increase the junction temperature, or by adjusting the control of the coolant loop 140 to lower or increase the junction temperature. A DC bus voltage may be applied to the power module 130. In some embodiments, the DC bus voltage may be the high-voltage provided by the battery pack 80. In other embodiments, the DC bus voltage may be the low-voltage provided by the low-voltage battery 82 to protect the power module 130 from damage due to possible faults. To apply a lower DC bus voltage, the battery pack 80 may be disconnected from the power transistors via the multiplexer 136. Thereafter, the controller circuit 110 waits until a target voltage value is reached. The target voltage value may be achieved by either passive discharging or active discharging the DC busses. The multiplexer 136 may also connect the low-voltage battery 82 to the power transistors.

Once the target DC bus voltage is achieved, a preconditioning process may be applied sequentially to each target power transistor in the power module 130. The power transistors 138a-138n, other than the target power transistor, may be switched on and the target power transistor is switched off. Utilizing the current-source gate driver circuit 120a or the voltage source gate driver circuit 120b, the gate-to-source voltage Vgs may be increased from zero volts toward the fully turned-on voltage. While the gate-to-source voltage Vgs is increasing, the transistor voltage Vds is monitored/measured via the desaturation circuit 126 to detect the transistor voltage Vds exceeding a threshold voltage, indicating the event of the target power transistor switching on. Control of the pulse width modulation signal may be used to shorten detection process while control the rate of change, to better control the junction temperate and/or reduce voltage and current overshoot when the target power transistor switches on. The other power transistors may be kept off if the power module 130 is a hybrid power module. Repeat the process to measure the other power transistors in the uni-power modules and the hybrid power modules.

Figure 8:
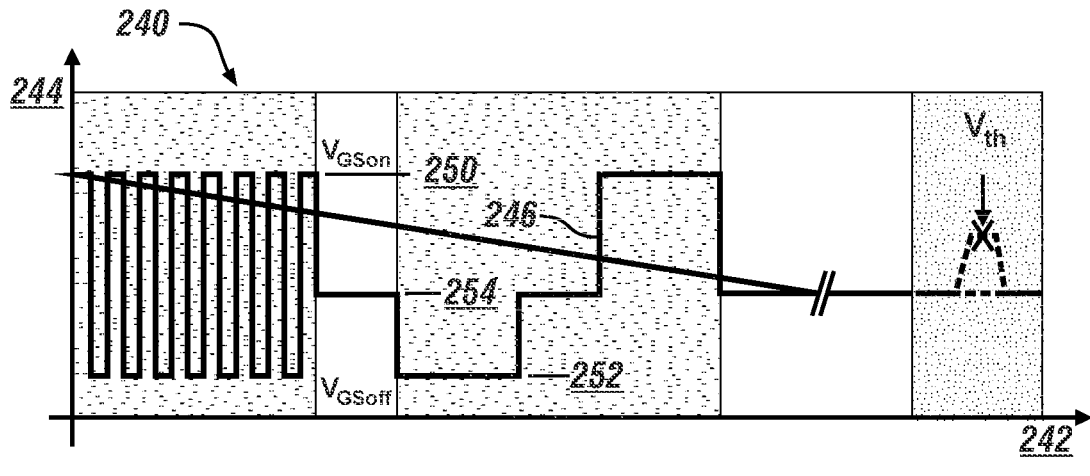
FIG. 8 is a graph of a preconditioning process in accordance with one or more exemplary embodiments.

Referring to FIG. 8, a graph 240 of an example preconditioning process is shown in accordance with one or more exemplary embodiments. The graph 240 has a first axis 242 in units of time and a second axis 244 in units of voltage amplitude. A curve 246 illustrates a preconditioning signal. Preconditioning generally ensures measurement accuracy of the threshold voltage Vth.

The preconditioning may begin by adjusting the junction temperature of the target power transistor by slow switching to heat, or coolant loop activation to cool or heat. The high-voltage DC bus is disconnected (e.g., control relays and/or the multiplexer 136 to disconnect the power module 130 from the battery pack 80). Thereafter, the preconditioning signal may be applied to the target gate node of the target power transistor.

The preconditioning signal may initially toggle multiple times between a first (e.g., high) gate-to-source voltage (Vgson) 250 that is guaranteed to switch on the target power transistor and a second (e.g., low) gate-to-source voltage (Vgsoff) 252 that is guaranteed to switch the target power transistor off. After the toggling, the gate-to-source voltage may be set at an intermediate voltage 254 (or at other voltage amplitude). Next, a long pulse at the second gate-to-source voltage 252 (or at other voltage amplitude) may be applied. The gate-to-source voltage Vgs is subsequently returned to the intermediate voltage 254. Next, a long pulse to the first gate-to-source voltage 250 is applied. The gate-to-source voltage Vgs is subsequently returned to the intermediate voltage 254. Thereafter, the preconditioning process may end and the process of determining the threshold voltage Vth may begin.

For a voltage-source gate driver circuit 120a, the electrical power supplied to the gate driver circuit 120 is controlled to present Vgson and Vgsoff amplitudes for preconditioning the target power transistor on and off. For a current-source gate driver circuit 120b, the variable current sources 124a-124n are utilized to control the current Ig into the target power transistor gate by pulse width modulation control or a pre-calibrated duration based on voltage feedback (e.g., ADC of the power supply) to achieve the target preconditioning Vgson and Vgsoff amplitudes. Variations in the threshold voltage measurements may result if performed without the preconditioning process.

Figures 9, 10:
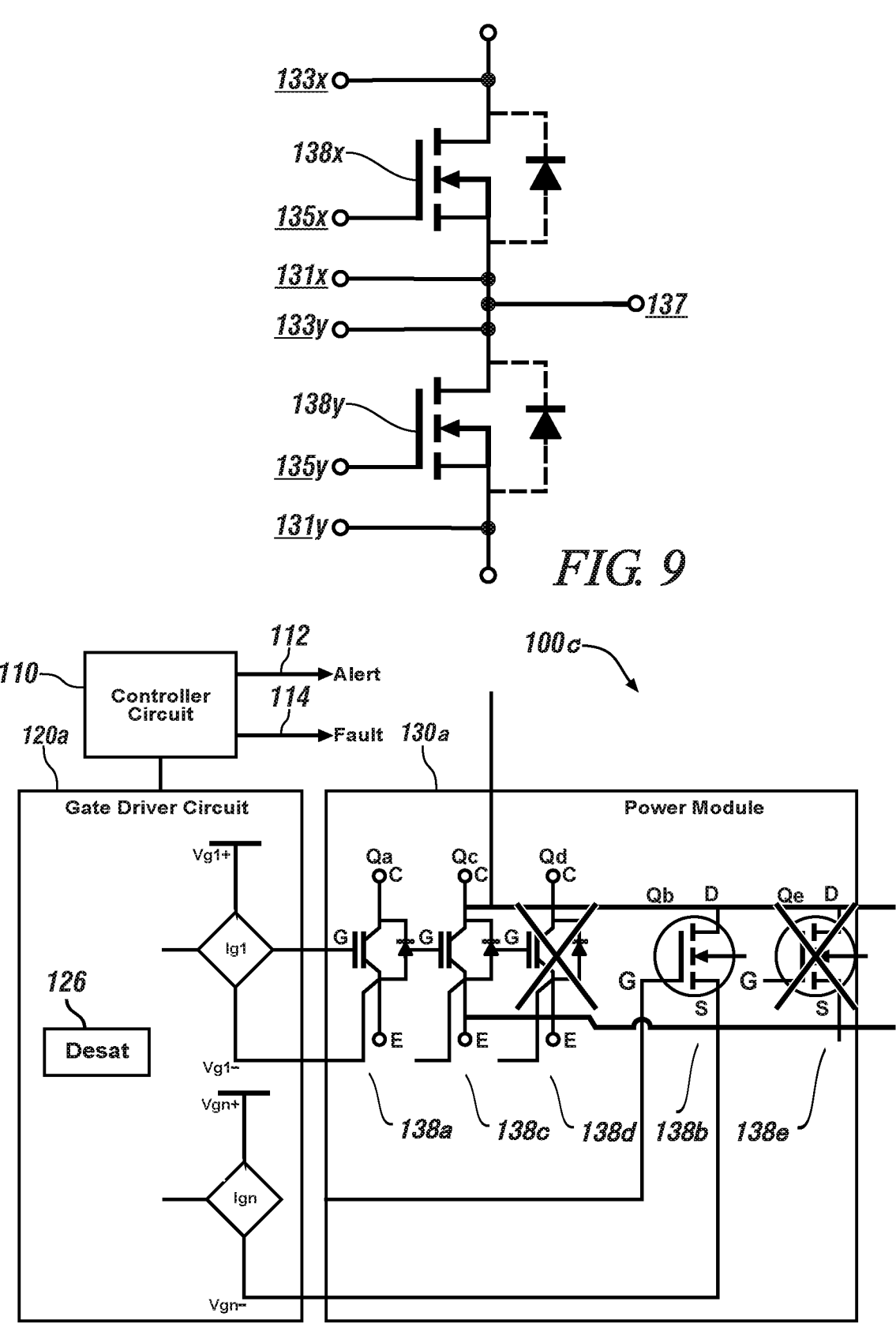
FIG. 9 is a schematic diagram of an implementation of two power transistors in a power module in accordance with one or more exemplary embodiments.
FIG. 10 is a schematic diagram of a power transistor fault detection in accordance with one or more exemplary embodiments.

Referring to FIG. 9 with references back to FIG. 1, a schematic diagram of an example implementation of two power transistors in the power module 130 are shown in accordance with one or more exemplary embodiments. Power transistors 138x and 138y may be arranged as a pull-up transistor and pull-down transistor pair. The pull-up power transistor 138x may be referred to as a high-side (HS) power transistor. The pull-down power transistor 138y may be referred to as a low-side (LS) power transistor. A low-side node 131x of the pull-up power transistor 138x may be connected to a high-side node 133y of the pull-down power transistor 138y. The low-side node 131y of the pull-down power transistor 138y may be connected to a negative DC bus. The high-side node 133x of the pull-up power transistor 138x may be connected to a positive DC bus. An output node 137 of the transistor pair may be connected to the electric load/motor 90/90a.

A process for transistor on-resistance Rdson measurements may begin by adjusting the junction temperature of the target power transistor 138x or 138y by slow switching to heat, or coolant loop 140 activation to cool or heat. The high-voltage DC bus is disconnected (e.g., control relays and/or the multiplexer 136) to disconnect the power module 130 from the battery pack 80. The preconditioning signal may subsequently be applied to a target gate node 135x or 135y of the target power transistor 138x or 138y, respectively.

After the preconditioning and the DC-link voltage reaches the target testing amplitude, the desaturation circuit 126 may be supplied by a voltage source or a current source outputting (I_desat). An output voltage (V_desat) of the desaturation circuit 126 and the target transistor current (Id) are concurrently monitored and measured. To improve temperature consistency and less noise, the desaturation voltage Vdesat may be measured for at least two different current points, both being within the constant Rdson region with respect to the target transistor current Id. The voltage may be measured by the ADC/Comp circuit in the gate driver circuit 120 through the desaturation circuit 126, and the drain current Id through the current sensor 134 or a shunt resistor/inductor while the load (e.g., motor) current is at a first current point (1) per equation 1 as follows:

$$V\_desat\_I_{d1} = R\_desat*I\_desat1 + V\_f_D + V\_zenner + Rdson*Id1 \qquad \text{Eq. (1)}$$

Where R_desat is the resistance of the resistor Rdesat and $Vf_D$ is the total forward voltage drop across a single or multiple blocking diodes D5 in FIG. 2, and the total voltage drop across a single or multiple Zenner diode, if implemented.

The voltage at a second current point (2) may be determined per equation 2 as follows:

$$V\_desat\_I_{d2} = R\_desat*I\_desat2 + V\_f_D + V\_zenner + Rdson*Id2 \qquad \text{Eq. (2)}$$

The on-resistance Rdson of the target transistor may be determined by equation 3 as follows:

$$Rdson = (V\_desat\_I_{d2} - V\_desat\_I_{d1} - R\_desat*(I\_desat2 - I\_desat1))/(Id2 - Id1) \qquad \text{Eq. (3)}$$

The voltages $V\_desat\_I_{d2}$ and $V\_desat\_I_{d1}$ may be measured after the circuit reaches an equilibrium to reduce the amplitude difference between the currents I_desat2 and I_desat1. A constant current source may be used to supply the desaturation circuit 126 to further reduce the amplitude difference to near or at zero. The process may be repeated to measure the Rdson of the other power transistors for uni-power modules and hybrid power modules.

Referring to FIG. 10 with references back to FIG. 2, a schematic diagram of an example power transistor fault detection is shown in accordance with one or more exemplary embodiments. The system 100c may include the controller circuit 110, the gate driver circuit 120 and a power module 130a. The power module 130a is a variation of the power module 130.

The controller circuit 110 may be operational to generate an alert signal 112. The alert signal may notify a driver or operator of the vehicle 70 that the power module 130a had degraded. Assertion of the alert signal 112 generally means that the power module 130a may need attention. A fault signal 114 may also be generated by the controller circuit 110. Assertion of the fault signal 114 generally means that the power module 130a has failed and should be replaced to prevent damage to the battery pack 80 and/or the electric load 90 or electric motor 90a.

The power module 130a is illustrated with multiple power transistors 138a-138e arranged in parallel. In the example, the power transistors 138a, 138c and 138d may have a common gate node. The power transistors 138b and 138e may have another common gate node. In various embodiments, the power transistor 138d and/or the power transistor 138e have become degraded and/or have failed. The power transistor faults may be detected by the gate driver circuit 120 and the controller circuit 110 via the measured threshold voltages Vth, the measured on-resistances Rdson and/or the desaturation circuit voltages Vdesat.

In various situations, the system 100c may measure the on-resistance Rdson, the threshold voltage Vth, and/or the desaturation circuit voltage Vdesat of each power transistor under a controlled temperature, as described above. A degraded condition may be detected where one or more of the power transistors 138a-138e has a fail-open condition from drain to source. In response to the degraded condition, the controller circuit 110 may assert the alert signal 112 to notify the driver that the power module 130a is degraded and may be in need of repair. If greater than a threshold number of the power transistors 138a-138e fail open, or if one or more power transistors 138a-138e has a fail-short condition from the drain to the source, the power module 130a may be considered faulty and should be replaced. Therefore, the controller circuit 110 may assert the fault signal 114 to notify the driver accordingly.

In various situations, a power transistors 138a-138e may experience a gate fail-open conditions. If one or a few power transistors 138a-138e are detected to have a gate fail-open condition, the alert signal 112 may be asserted. If greater than a gate threshold number of the power transistors 138a-138e have the gate fail-open, the fault signal 114 may be asserted.

To detect a gate fail-open condition, the controller circuit 110 and the gate driver circuit 120 may measure the transistor voltage Vds via the desaturation circuit 126. The gate fail-open condition generally means that the target power transistor has a smaller gate-to-source capacitance (Cgs) and thus reaches the threshold voltage of the desaturation circuit Vds_desat faster if given the same Ig/Vg pulse width modulation pulses and the same preconditioning process. In various embodiments, the Vds_desat rise time is measured through the ADC/Comp circuit 124a. In other embodiments, the Vgs rise time may be measured through the ADC/Comp circuit 124a or through the current feedback of a voltage-controlled gate driver circuit 120b via a parasitic inductance, a shunt resistor, or a current sensor. The process to measure the Rdson of the other power transistors 138a-138e may be repeated for uni-power modules and hybrid power modules.

Figure 11:
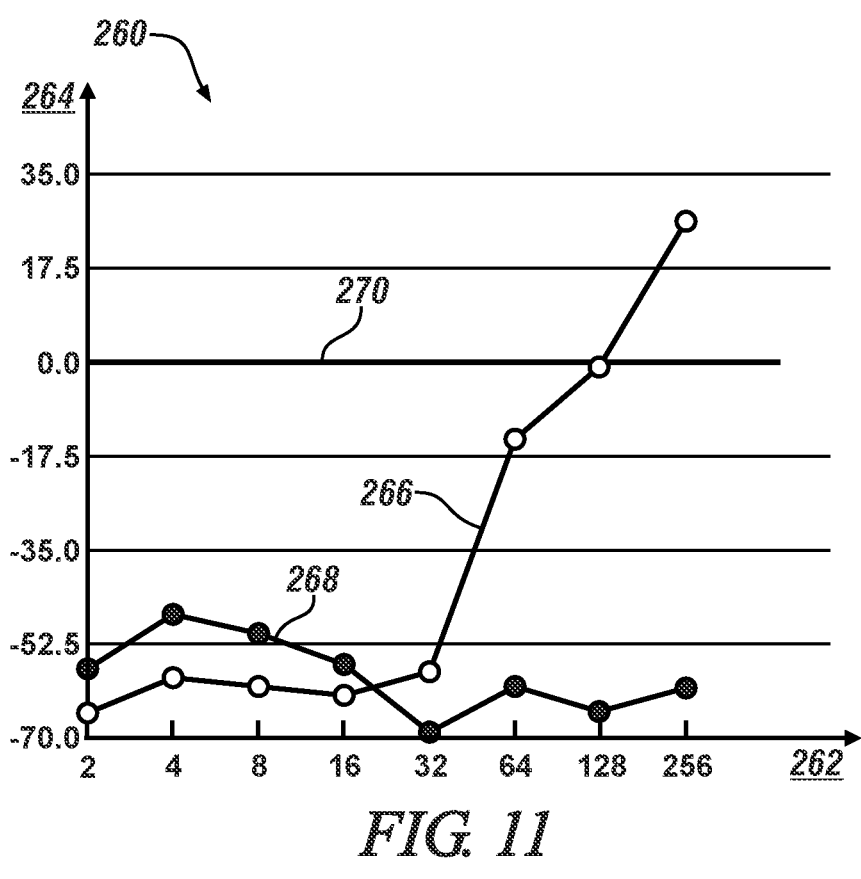
FIG. 11 is a graph that illustrates the power transistor fault detection in accordance with one or more exemplary embodiments.

Referring to FIG. 11, a graph 260 of an example power transistor fault detection is shown in accordance with one or more exemplary embodiments. The graph 260 has a first axis 262 in measurement instance, and a second axis 244 in Vth measurement results. A first curve 268 illustrates the threshold voltage Vth of a first power transistor under test that starts to have degradation issues after time instance 32. A second curve 268 illustrates the threshold Vth of a second power transistor under test with no degradation. Line 270 illustrates the threshold of Vth with no degradation.

Figure 12:
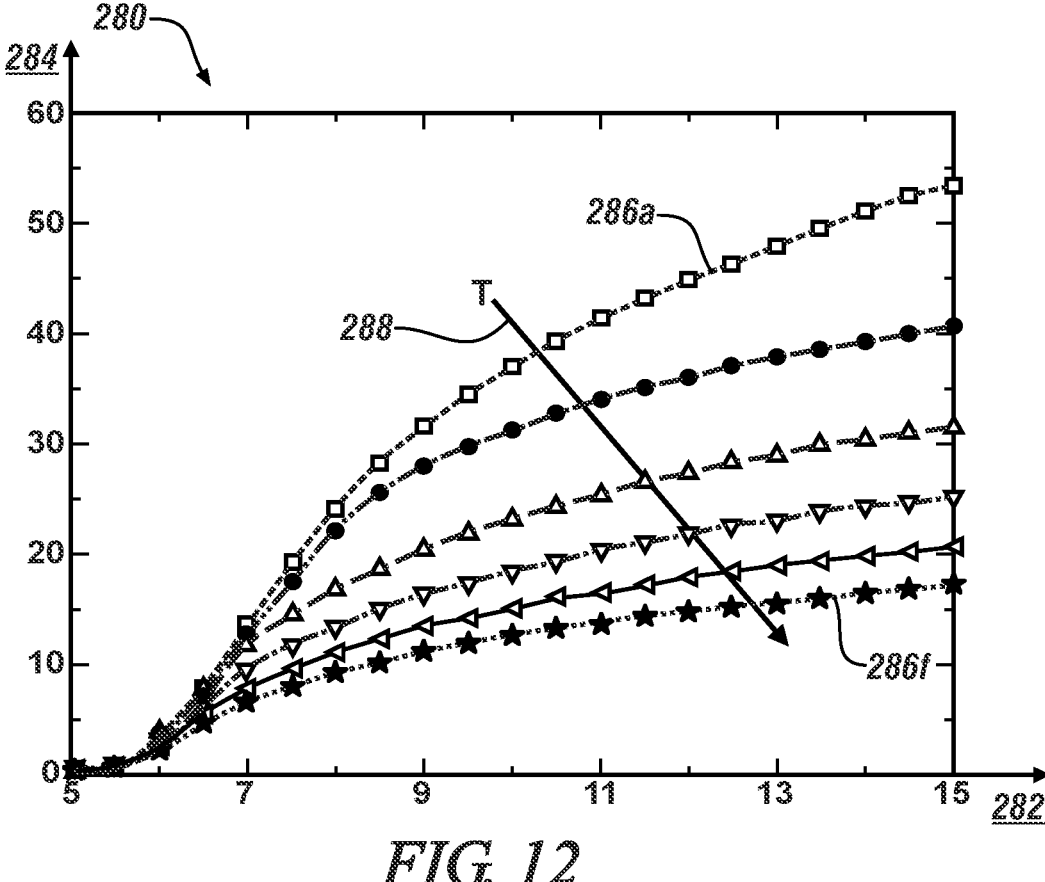
FIG. 12 is a graph of a junction temperate as a function of on-resistance in accordance with one or more exemplary embodiments.

Referring to FIG. 12, a graph 280 of an example junction temperate as a function of on-resistance is shown in accordance with one or more exemplary embodiments. The graph 280 includes a first axis 282 in units gate-to-source voltages Vgs, and a second axis 284 in units of drain current $I_D$ in microamperes. At a transistor voltage Vdc of one volt in the example, the curves 286a-286f represent transistor transfer curves at temperatures from 300K (curve 286a) to 500K (curve 286f). Arrow 288 shows a decreasing drain current $I_D$ or increasing on resistance Rdson as the junction temperature increases. The above Rdson measurement methods may be used to measure the junction temperature of transistor die of a uni-semiconductor power switch or hybrid power switch.

Embodiments of the disclosure generally provides a built-in measurement method for voltage thresholds Vth and on-resistances Rdson for power transistors in a power module. The measurements enable a controller circuit to optimize inverter control and detect degradation and fault of hybrid power modules. A gate drive circuit may measure the threshold voltages Vth and on-resistances Rdson of the power modules and/or the internal switches using controlled variable current sources or variable voltage sources. The on-resistances Rdson and threshold voltages Vth may be measured at a reduced power bus voltages (Vdc) by passive discharge or active discharge of high-voltage battery packs. An integrated preconditioning process may be applied to the power transistor gates to ensure high precision measurements of the threshold voltages Vth and the on-resistances Rdson. An isolated method may be employed to measure the on-resistances Rdson of both high-side power transistors and low-side power transistors or individual die. The measured threshold voltages Vth and/or the measured on-resistances Rdson may be used to detect transistor degradation and/or measure die temperature.

The system and method are applicable to hybrid power modules having different substrates (e.g., Si, SiC, GaN, $Ga_2O_3$, Diamond), implement different semiconductor technologies (e.g., IGBT, MOSFET, HEMT, JFET, Cascode, BJT) and have different physical geometries. The system and method enable improved inverter control to adjust switching speed based on the threshold voltage Vth prognosis.

Embodiments of the disclosure enable implementations with wide bandgap (WBG) semiconductors, and transistor die having large manufacturing variations in threshold voltages Vth and/or on-resistances Rdson. The system maintains performance despite small threshold voltages Vth that led to fast transient of voltages/current in switching, potentially increasing stress on the power modules, inverters, and electric drive motors. The system tolerates large on-resistances Rdson that lead to power losses, may cause imbalances among the dies and power transistors, and may create static current deviations. The hybrid switch may integrate switches of different materials, different technologies and/or different sizes to enhance advantages and compensate for conflicts. For example, Si IGBT power transistors have high switching losses due to larger capacitances, tail current, etc. SiC MOSFET power transistors have lower switching loss and better thermal conductivity. Larger device differences and more complex structures and control cause more serious effects on the performance of the hybrid switches. SiC power transistors have large Vth and Rdson variations. IGBT power transistors have larger stray inductances that may cause current imbalances, overshoot, power loss, and the like. With the built-in measurements and prognostics, the system may maintain high switching speeds without overshoots due to part-to-part variations and degradations that would otherwise effect power losses and performance.

Embodiments of the disclosure generally provide a system for prognosis and control of a power module for an electric load. The system includes a gate driver circuit and a controller circuit. The gate driver circuit is couplable to a target power transistor in the power module. The target power transistor generally includes a target gate node, a drain/collector (high-side) node, and source/emitter (low-side) node.

The gate driver circuit is operational to drive the gate node in response to a pulse width modulation signal. The gate driver circuit may measure a gate voltage between the gate node and the source/emitter node, switch a desaturation signal in response to the target power transistor switching between an off state and an on state, measure a transistor voltage between the drain/collector node and the source/emitter node, and measure a transistor current from the drain/collector node to the source/emitter node.

The controller circuit is operational to modulate the pulse width modulation signal to increase the gate voltage, determine a threshold voltage of the target power transistor as the gate voltage in response to the desaturation signal switching from the off state to the on state, determine an on-resistance of the target power transistor based on the transistor voltage and the transistor current, and control the target power transistor based on the threshold voltage and the on-resistance, as measured.

Numerical values of parameters (e.g., of quantities or conditions) in this specification, including the appended claims, are to be understood as being modified in each instance by the term "about" whether or not "about" actually appears before the numerical value. "About" indicates that the stated numerical value allows some slight imprecision (with some approach to exactness in the value; about or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of values and further divided ranges within the range. Each value within a range and the endpoints of a range are hereby disclosed as a separate embodiment.

While the best modes for carrying out the disclosure have been described in detail, those familiar with the art to which this disclosure relates will recognize various alternative designs and embodiments for practicing the disclosure within the scope of the appended claims.

What is claimed is:

1. A system for prognosis and control of a power module for an electric load comprising:
   a gate driver circuit couplable to a target power transistor in the power module, wherein:
      the target power transistor includes a target gate node, a target high-side node, and a target low-side node; and
      the gate driver circuit is operational to:
         drive the target gate node in response to a pulse width modulation signal;
         measure a target gate voltage between the target gate node and the target low-side node;
         switch a desaturation signal in response to the target power transistor switching between an off state and an on state;
         measure a target transistor voltage between the target high-side node and the target low-side node; and
         measure a target transistor current from the target high-side node to the target low-side node; and
   a controller circuit in electrical communication with the gate driver circuit, and operational to:
      modulate the pulse width modulation signal to increase the target gate voltage;

determine a target threshold voltage of the target power transistor as the target gate voltage in response to the desaturation signal switching from the off state to the on state;
      determine a target on-resistance of the target power transistor based on the target transistor voltage and the target transistor current; and
      control the target power transistor based on the target threshold voltage and the target on-resistance.

2. The system according to claim 1, wherein the controller circuit is further operational to:
   command a reduction of a high-power voltage received by the power module during the determinations of the target threshold voltage and the target on-resistance of the target power transistor.

3. The system according to claim 1, wherein the measurement of the target transistor voltage is performed at a predetermined testing temperature and two different current points.

4. The system according to claim 1, wherein the controller circuit is further operational to:
   control the gate driver circuit to precondition the target gate node prior to the determinations of the target threshold voltage and the target on-resistance of the target power transistor.

5. The system according to claim 1, wherein the pulse width modulation signal is modulated at a plurality of different amplitudes.

6. The system according to claim 1, wherein the controller circuit is further operational to:
   control a temperature of the power module to one or more of (i) an efficient operating temperature and (ii) a peak torque operating temperature during the determinations of the target threshold voltage and the target on-resistance of the target power transistor.

7. The system according to claim 1, wherein the controller circuit is further operational to:
   control a sampling timing for the measurements of the target transistor voltage and the target transistor current.

8. The system according to claim 1, wherein the power module includes a plurality of power transistors, and the controller circuit is further operational to:
   command one or more of (i) the gate driver circuit and (ii) a multiplexer to electrically isolate the target power transistor from the plurality of power transistors during the determinations of the target threshold voltage and the target on-resistance of the target power transistor.

9. The system according to claim 1, wherein the controller circuit is further operational to:
   detect a degradation of the target power transistor based on the target threshold voltage and the target on-resistance.

10. The system according to claim 1, wherein the controller circuit is further operational to:
   detect a failure of the target power transistor based on the target threshold voltage and the target on-resistance.

11. The system according to claim 1, wherein the controller circuit is further operational to:
   calculate a temperature of the target power transistor based on the target on-resistance.

12. The system according to claim 1, wherein the power module includes a plurality of power transistors, and the plurality of power transistors include one or more of (i) a plurality of different transistor types and (ii) a plurality of different semiconductor types.

13. The system according to claim 1, further comprising:
a galvanic isolation circuit between a high-power voltage received by the power module and a power supply voltage received by the controller circuit.

14. The system according to claim 1, wherein the power module includes a plurality of power transistors having a plurality of threshold voltages and a plurality of on-resistances, and the controller circuit is further operational to:
adjust one or more of (i) a switching speed of the plurality of power transistors and (ii) switch utilization ratio of the plurality of power transistors based on one or more of (1) the plurality of threshold voltages and (2) the plurality of on-resistances.

15. The system according to claim 1, wherein the controller circuit is further operational to:
utilize the target threshold voltage and the target on-resistance for one or more of thermal control, dynamic switching control, and degradation mitigation of the target power transistor.

16. The system according to claim 1, further comprising one or more of:
a discrete temperature sensor operational to measure a temperature of the target power transistor; and
a discrete current sensor operational to measure the target transistor current.

17. The system according to claim 1, wherein the controller circuit is further operational to:
detect a degradation in the target power transistor based on one or more of the target threshold voltage and the target on-resistance; and
assert an alert signal in response to the detection of the degradation.

18. The system according to claim 1, wherein:
the gate driver circuit is further operational to measure one or more of (i) a current across a parasitic inductance in series with the target power transistor, and (ii) a voltage across a parasitic capacitance in parallel with the target power transistor; and
the controller circuit is further operational to calculate a switching speed of the target power transistor in response to one or more of (i) the current across the parasitic inductance, and (ii) the voltage across the parasitic capacitance.

19. A method for prognosis and control of a power module for an electric load comprising:
driving a target gate node of a target power transistor of the power module in response to a pulse width modulation signal with a gate driver circuit, wherein the target power transistor includes the target gate node, a target high-side node, and a target low-side node;
measuring a target gate voltage between the target gate node and the target low-side node;

switching a desaturation signal in response to the target power transistor switching between an off state and an on state;
measuring a target transistor voltage between the target high-side node and the target low-side node;
measuring a target transistor current from the target high-side node to the target low-side node;
modulating the pulse width modulation signal to increase the target gate voltage with a controller circuit in electronic communication with the gate driver circuit;
determining a target threshold voltage of the target power transistor as the target gate voltage in response to the desaturation signal switching from the off state to the on state;
determining a target on-resistance of the target power transistor based on the target transistor voltage and the target transistor current; and
controlling the target power transistor based on the target threshold voltage and the target on-resistance.

20. A vehicle comprising:
an electric motor;
a power module electrically coupled to the electric motor;
a gate driver circuit couplable to a target power transistor in the power module, wherein:
the target power transistor includes a target gate node, a target high-side node, and a target low-side node; and
the gate driver circuit is operational to:
drive the target gate node in response to a pulse width modulation signal;
measure a target gate voltage between the target gate node and the target low-side node;
switch a desaturation signal in response to the target power transistor switching between an off state and an on state;
measure a target transistor voltage between the target high-side node and the target low-side node; and
measure a target transistor current from the target high-side node to the target low-side node; and
a controller circuit in electrical communication with the gate driver circuit, and operational to:
modulate the pulse width modulation signal to increase the target gate voltage;
determine a target threshold voltage of the target power transistor as the target gate voltage in response to the desaturation signal switching from the off state to the on state;
determine a target on-resistance of the target power transistor based on the target transistor voltage and the target transistor current; and
control the target power transistor based on the target threshold voltage and the target on-resistance.

* * * * *